United States Patent [19]

Cummins et al.

[11] Patent Number: 5,359,547
[45] Date of Patent: Oct. 25, 1994

[54] METHOD AND APPARATUS FOR TESTING PROCESSOR-BASED COMPUTER MODULES

[75] Inventors: William H. Cummins, Tewksbury, Mass.; R. Stephen Polzin, Morgan Hill; Richard Heye, Sunnyvale, both of Calif.

[73] Assignee: Digital Equipment Corporation, Maynard, Mass.

[21] Appl. No.: 904,784

[22] Filed: Jun. 26, 1992

[51] Int. Cl.⁵ .................................. G06F 11/22
[52] U.S. Cl. .................. 364/580; 371/16.1; 371/22.1; 371/22.3
[58] Field of Search ............ 364/580; 371/16.1, 16.5, 371/18, 17, 22.3, 22.1

[56] References Cited

U.S. PATENT DOCUMENTS

| | | | |
|---|---|---|---|
| 3,777,129 | 12/1973 | Mehia | 235/151.3 |
| 4,070,565 | 1/1978 | Borrelli | 235/302 |
| 4,168,527 | 9/1979 | Winkler | 364/580 |
| 4,280,220 | 7/1981 | Vaeches | 371/27 |
| 4,354,268 | 10/1982 | Michel et al. | 371/20 |
| 4,602,210 | 7/1986 | Fasano et al. | 371/22.3 |
| 4,622,647 | 11/1986 | Sagnard et al. | 364/580 |
| 4,701,870 | 10/1987 | Mogi et al. | 364/580 |
| 4,703,446 | 10/1987 | Momose | 364/580 |
| 4,811,345 | 3/1989 | Johnson | 371/16.1 |
| 4,829,520 | 5/1989 | Toth | 371/22.1 |
| 4,862,399 | 8/1989 | Freeman | 364/580 |
| 4,926,363 | 5/1990 | Nix | 364/579 |
| 4,989,208 | 1/1991 | Akao et al. | 371/16.1 X |
| 5,103,167 | 4/1992 | Okano et al. | 371/22.1 X |
| 5,121,393 | 6/1992 | Charvin | 371/16.1 |
| 5,130,645 | 7/1992 | Levy | 371/22.1 X |
| 5,172,378 | 12/1992 | Sugioka et al. | 371/16.1 X |

*Primary Examiner*—Jack B. Harvey
*Assistant Examiner*—Eric W. Stamber
*Attorney, Agent, or Firm*—Denis G. Maloney; Albert P. Cefalo

[57] ABSTRACT

A method and apparatus for testing complex processor-based computer modules and their associated computer systems by allowing the normal initialization path between a memory component storing code utilized during initialization and the processor to be interrupted and test code from an external test system to be substituted for initialization code. Following initialization, a two-way communication link between the processor and the test system is created to allow interactive testing and status reporting. The testing method and apparatus maximizes the likelihood of precisely identifying defects on the module under test.

25 Claims, 2 Drawing Sheets

METHOD AND APPARATUS FOR TESTING PROCESSOR-BASED COMPUTER MODULES

FIELD OF THE INVENTION

The present invention relates generally to computer module testing systems, and more particularly to a computer module having a processor and formed to enable dynamic testing of the module by an external test system using test sequences which can be selectively introduced to the processor.

BACKGROUND OF THE INVENTION

Today's computer modules, especially those utilizing processors, are highly complex, both in their physical layout and in their logical capabilities. This complexity leads to many possibilities for defects and contributes significantly to the difficulty in locating these defects. In the past, when computer modules were simple and less expensive, and basic testing could not locate a defect, the most cost-effective solution may have been to discard the module. However, present computer modules are significantly more complex and very costly both in material costs as well as in manufacturing costs. It is not cost-effective to discard defective modules. Instead, complex test equipment and testing methods must generally be employed to precisely identify and locate defects, such that effective repairs can be made.

The purpose of testing a computer module is to determine, first, if the computer module has any defects and, if so, to locate these defects such that they can be repaired. Hence, an expensive computer module can be salvaged rather than discarded. Error detection may be costly, both in terms of the test equipment required and a technician's time to perform testing. Moreover, subsequent module repair may damage the module under test (MUT) when components are removed, wires added, etch cut, etc. Because of this, computer module testing strives for precise definition of the defects to increase the possibility that the module will be functional upon repair and to decrease the possibility that the module may have additional defects and require further testing and repair.

A common technique for testing complex modules with on-board processors involves the addition of test sequences to the processor's initialization code. Many processor-based computer modules have Read-Only Memory (ROM) components which supply code utilized by the processor during initialization. The inclusion of test sequences with the initialization code stored in the ROM allows the processor to initialize and test itself, and begin testing other components on the module. The code utilized during initialization may also contain a pointer to additional code stored in other memory components on the MUT. The additional code stored in these memory components comprises more extensive test sequences.

Frequently, the processor on the MUT must rely on a substantial amount of untested hardware also on the MUT to retrieve the code utilized during initialization from the ROM. This hardware usually comprises highly integrated components capable of executing complex commands and may generally include a combination of a large number of components with high pin counts and connections, leading to many possibilities for defects. If the module has a defect in the hardware relied upon to retrieve the code, the processor may not be able to access the ROM or the code retrieved may be corrupted. This may render the module untestable. If the ROM containing the code is directly connected to the processor, then this problem may be substantially eliminated because few connections or other components need be relied upon.

The processor typically loads the code utilized during initialization into an internal instruction cache (I-cache) and therefore, the amount of code accepted by the processor is usually limited by the size of the processor's I-cache. More extensive test sequences which may be expressed in more code than can be loaded during initialization may be needed to fully test the module in order to precisely locate any defects. Memory components on the MUT external to the processor may be used to store extensive test sequences, but are generally not directly connected to the processor. Therefore, to retrieve the extensive test sequences a substantial amount of untested hardware may need to be relied upon leading to the difficulties discussed above.

Once the test sequences are retrieved and executed by the processor, status reporting is usually accomplished through some general manifestation of a pass or fail condition on the module itself. For example, a light emitting diode (LED) may be activated by the processor if the module passes all the tests within the test sequence or remain deactivated if the module fails any tests. If a failure is indicated in such a way, there may be no information available as to which of multiple tests within a testing sequence the module failed or what the defect might be.

Another testing method involves the application of digital logic patterns to the MUT from an external source and the reception of resulting digital logic patterns from the MUT which may then be compared to known correct patterns to determine if there is an error. Electrical contact to the points on the module used for pattern application and/or reception is required. These may be in many different locations, such as the module's edge connectors, various nodes (points at which components are connected) located on the module, or the pins of processor chips or other integrated circuit components. The most familiar type of test equipment used in applying and receiving patterns is the "bed of nails" tester, where one "nail" is used to electrically contact a node of the MUT and apply or receive patterns from the node.

Often nodes required to test the MUT may not be accessible for contact by a nail. This may be due to the node being hidden under a double-sided-surface mounted component or due to the node being buried in a multi-layer printed circuit board.

In order to fully test complex module's of the type to which the invention pertains, a large number of test patterns are generally required. The test equipment may not be able to store a sufficient subset of the large number of patterns required to fully test the module, and therefore, the test equipment may not be able to fully test the module. The test equipment must store not only the patterns to be applied, but also the patterns received and the patterns to which the received patterns will be compared. Moreover, the test equipment may not be able to operate at the speed at which the processor is capable of operating, and errors which may only occur at the higher operating speed of the processor may not be detectable at lower operating speeds.

Test equipment which applies patterns to the MUT and receives resulting patterns from the MUT is intrusive in that there is physical contact between the test equipment and the MUT. This contact may itself create defects by causing damage to the MUT in the form of cut or interrupted etch (opens), broken pins, etc. The test equipment may also conceal already existing defects by temporarily alleviating the defect. For example, an open between two pieces of etch or between a component pin and its associated module pad may be bridged when the contact by the test equipment completes the circuit.

Another testing method which has been used for complex modules replaces the ROM which stores the code utilized by the processor during initialization with a plug-type connector attached to the MUT where the ROM pins would normally be attached. The plug-type connector allows attachment to test equipment through a cable. The test equipment can provide the processor with code which includes initialization code as well as test sequences to be executed by the processor. This allows new test sequences to be loaded into the processor by re-initializing the processor instead of removing the ROM and blasting new code into the ROM each time new sequences are needed.

Many of the difficulties associated with testing methods which include initialization code and test sequences in the ROM itself may also be experienced when using this ROM replacement testing method. As previous pointed out, if the processor needs to rely on a significant amount of untested hardware to access the ROM, this ROM replacement testing method may not be particularly useful. Also, as previously mentioned, the amount of code accepted by the processor during initialization may be limited which may prevent the loading of comprehensive tests. Incremental loading of comprehensive tests may also not be possible through this ROM replacement testing method, because for additional test sequences to be loaded, the processor needs to be re-initialized, which would erase any previously loaded code. Additionally, as pointed out above, status reporting may be limited to manifestations on the MUT. A pass/fail indication provides no information about which test the module failed or what type of defect is present.

Replacing the ROM with a plug-type connector may prevent testing the MUT in conjunction with the computer system for which the MUT was designed to be utilized. The plug-type connector may require more space than what is available between modules properly seated in the intended computer system. In order to use this connector while the MUT is connected to its intended computer system, the MUT may have to be connected to an extender card. An extender card extends the electrical and physical connections between the MUT and the computer system such that the MUT may be electrically connected to the computer system, but physically stand out from the other modules making up the computer system. One difficulty is that often today's computer systems depend on the precise timing and loading of signals on the system bus. The increased physical length of the electrical connections between the module and the computer system may add timing delay and capacitive loading to the signals. This change to the signal's characteristics may not permit the MUT to properly operate in the computer system. Therefore, it may not be possible to test the MUT in conjunction with the computer system using test equipment connected to a plug-type connector on the MUT.

Once a defect is reported, a more precise definition of the defect may be needed to make effective repairs to the module. New test sequences may be written and loaded into the processor. However, the amount of test code required to recreate the error and continue testing beyond the point where the error occurs may be too large for the processor to accept during initialization. Thus, the test equipment may be unable to determine the defect more precisely. In the case of intermittent errors, it may be very difficult to recreate the error at all.

The ROM replacement test method is intrusive, due to the physical contact between the module and the plug-type connector replacing the ROM and the necessity of removing the ROM prior to attaching the connector. Many of the difficulties mentioned with regard to the intrusiveness of the bed-of-nails tester may occur with this test method as well.

It is therefore desirable to provide a method and apparatus which allows a complex computer module to be dynamically and comprehensively tested and which avoids the foregoing and other disadvantages of known methods and apparatus. It is to these ends the present invention is directed.

SUMMARY OF THE INVENTION

The foregoing and other objects of the present invention may be accomplished by providing a testing method and arrangement which includes on a module under test (MUT) interruption hardware disposed between the memory component used to store code utilized during initialization (hereinafter referred to as initialization code) and the processor which permits interruption of the normal initialization path to the processor, and means for substituting a test code for the initialization code. The testing arrangement also includes hardware which allows the MUT to be connected to an external testing system such that the external testing system may substitute the test code for the initialization code during processor initialization and receive corresponding responses.

The interruption hardware may comprise combinational logic which is functionally equivalent to a switch, e.g., a multiplexor or a logic gate. The connection hardware may comprise a test connector located so as to permit the testing system to be connected to the MUT while the MUT is attached normally to the computer system amongst other computer modules. This location may be on an edge of the MUT opposite to the MUT connectors used to attach the MUT to a computer system. This enables the test system to test the MUT in conjunction with the computer system. The connection hardware may further include a buffer disposed between the test connector and the other components resident on the MUT to provide predetermined voltage and current levels to the connector and the MUT.

The testing arrangement permits the testing system to substitute the test code for the initialization code in a substantially unintrusive manner. The testing arrangement is unintrusive in that no components are removed or replaced and the only contact between the test system and the MUT is through the test connector which is designed for such a contact.

Following initialization, a two-way communication link is established between the MUT and the test system through the testing arrangement. This two-way communication link between the processor and the test system allows interactive test loading and status reporting without having to re-initialize the processor. The amount of test code which can be loaded interactively is not limited to the amount of code accepted by the processor during initialization.

DETAILED DESCRIPTION

The invention generally involves a method and apparatus for testing complex modules, such as processor-based computer modules and will be described in that context. It will be appreciated, however, that the invention has applicability to testing other types of modules and to other testing situations.

Figure 1:
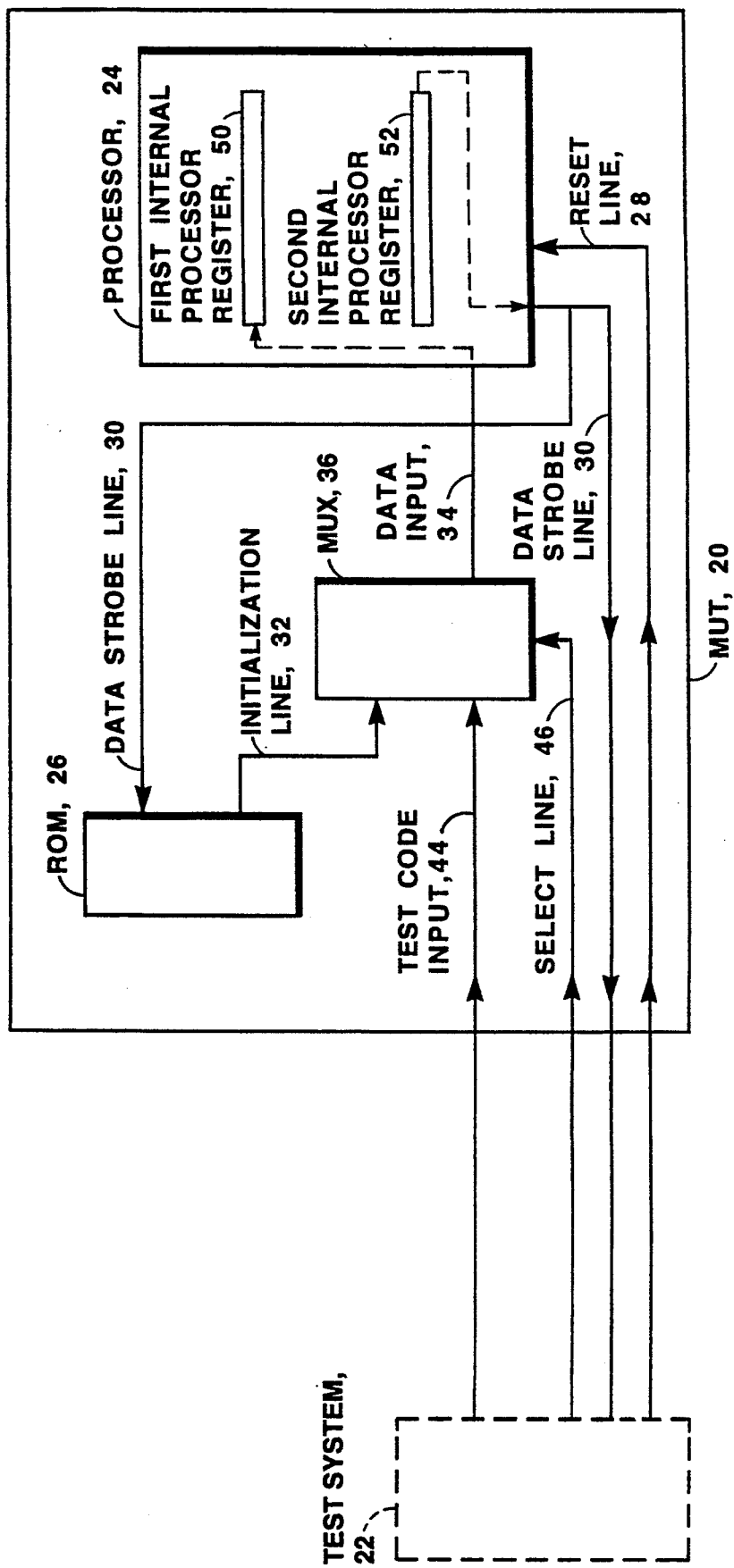
FIG. 1 is a block diagram depicting a testing arrangement in accordance with the invention for testing a processor-based computer module using an external testing system.

FIG. 1 illustrates a testing arrangement in accordance with the invention which enables a MUT 20 to be tested by a test system 22. As shown in FIG. 1 and as will be described in more detail hereinafter, the MUT 20 comprises a processor 24 which serves as the central processing device on the module and a read only memory component (ROM) 26 which may be employed for storing code utilized by the processor 24 during initialization. This code will be termed initialization code hereinafter, however, it will be understood by those skilled in the art that this code can comprise any type of code, for example, test code, initialization code, and/or controller code, etc. as will be described later.

Initialization occurs when the MUT 20 is powered up or when the processor 24 is reset. In either case, a reset line 28 to the processor is asserted to begin initialization, and upon the deassertion of the reset line 28, the processor requests the initialization code from the ROM 26. The processor requests the initialization code through the use of a data strobe line 30. Each assertion of the data strobe line 30 is a request for data.

The cycle time of the data strobe line 30, the time between assertion edges of the data strobe line, is generally much slower than the cycle time that the processor 24 is capable of. The processor may operate at full speed while maintaining the data strobe line at a cycle time consistent with the time required to access the ROM 26. At all times following reset and I-cache load, the processor and the MUT 20 operate according to the processor's operating speed.

As shown in FIG. 1, the data is provided from ROM 26 to processor 24 via two lines, i.e., initialization line 32 and data input line 34. The amount of data received with each request depends on the number of connections between the ROM 26 and the processor 24. If there is a single connection between the ROM and the processor (as shown in FIG. 1), then the data is received serially (one bit), and if there are multiple connections, then the data is received parallelly (eight connections equals a byte of data, etc.). The processor may store the initialization code from the ROM in its internal instruction cache (I-cache) and stop requesting the initialization code when its I-cache is filled.

Also included in the testing arrangement, as shown in FIG. 1, a multiplexor (MUX) 36 or other logic switching element may be disposed between the processor 24 and the ROM 26, such that the initialization line 32 is attached to a first input of the MUX and the data input line 34 is attached to an output of the MUX. As will be described, the MUX 36 functions as a means for allowing the initialization path between the ROM and the processor (initialization line 32 / data input line 34) to be interrupted and permits the substitution of test code from the test system 22 for the initialization code from the ROM. The test code may comprise processor initialization code, a testing sequence, or controller code, which will be discussed in more detail hereinafter.

Figure 2:
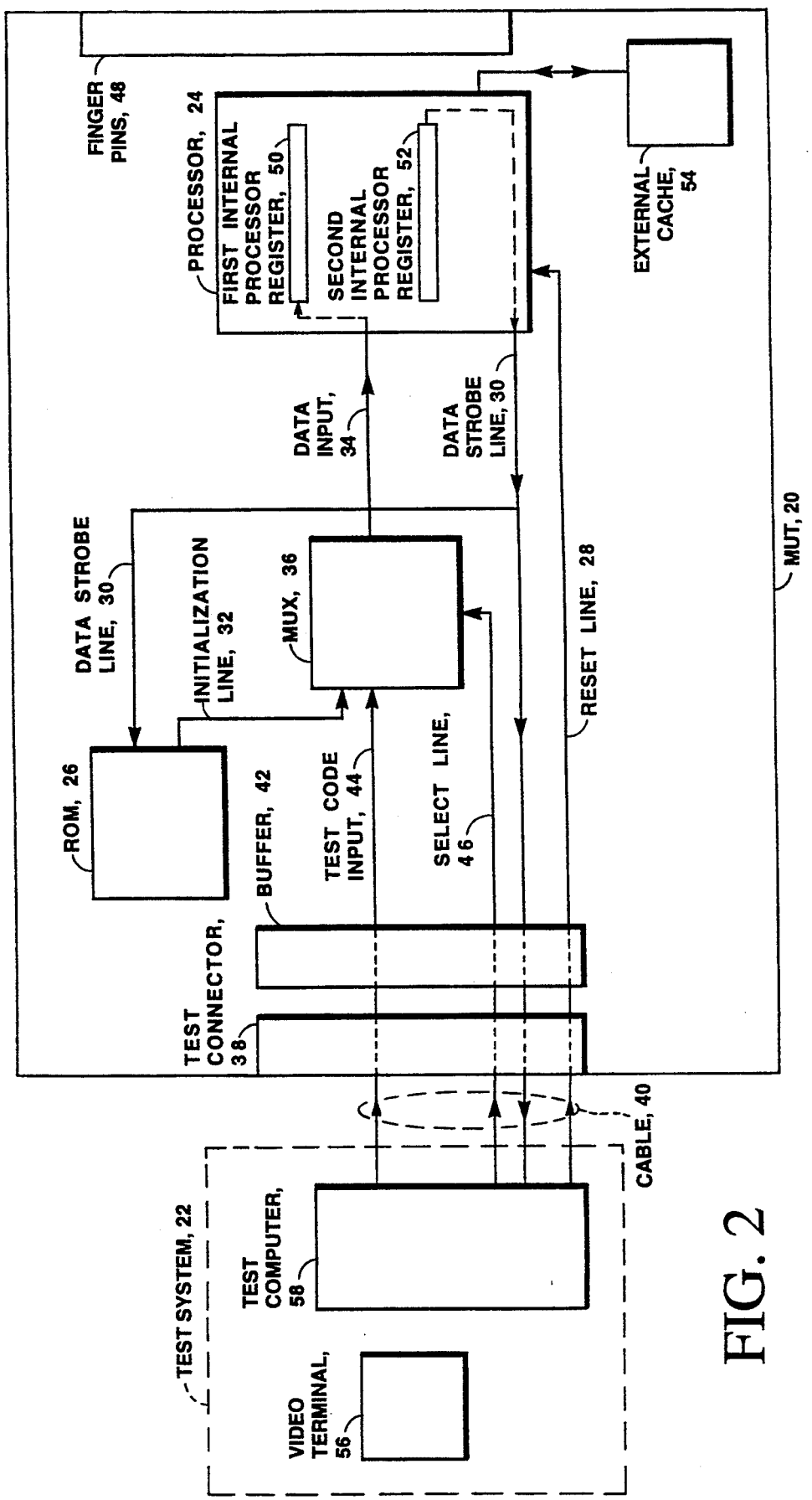
FIG. 2 is a more detailed block diagram of the testing arrangement and testing system depicted in FIG. 1.

FIG. 2 provides a more detailed illustration of a preferred construction of the testing arrangement of FIG. 1, and connection between the testing system 22 and the MUT 20. As shown in FIG. 2, the testing arrangement may include a test connector 38 which permits the test system to be electrically connected to the MUT by a cable 40. A buffer 42 also may be interposed between the test connector 38 and the other components resident on the MUT, as shown. The buffer 42 may provide isolation and predetermined voltage and current levels between the MUT and the test system 22.

The test system 22 is electrically connected through the test connector 38 to a second data input of the MUX 36, referred to hereinafter as the test code input line 44, to allow test code to be supplied to the MUX. The test system is further electrically connected through the test connector 38 to a select line 46 of the MUX to allow the test system to control the flow through of the MUX. The test system may provide test code to the processor through the test code input line 44 by asserting the select line 46 of the MUX 36 to cause the MUX to permit data on the test code input line to flow through the MUX to its output in place of the initialization code from the ROM 26 on initialization line 32. The MUX'S output is directly connected to the processor's data input line 34 used to provide the initialization code to the processor. The MUX thus serves as a switch that interrupts the initialization path between the ROM and the processor to enable external test code from test system 22 to be substituted for the initialization code from the ROM.

The test system 22 is also electrically connected through the test connector 38 to the processor's reset line 28 and data strobe line 30. In order for the test system to load the processor with test code as a substitution for the initialization code, the test system first interrupts the normal ROM to processor initialization path as described above. It then asserts the reset line 28 to the processor to begin initialization, and next deasserts the reset line and provides data through the MUX 36 in response to the processor's request for data. As described previously, the processor requests data through the use of the data strobe line 30.

As will be appreciated by those skilled in the art, the MUX 36 is only one embodiment of many possible interruption devices which may be used to substitute test code for the initialization code. Any switch or other functionally equivalent combination of module-resident hardware (combinational logic) will suffice. However, since untested logic is being relied upon to load the test code into the processor 24, the number of connections should be kept to a minimum to reduce the possibility of defects that might have an adverse effect upon code loading. In the preferred embodiment of the invention, the initialization path is a serial path (as shown in FIGS. 1 and 2). A serial path is preferred over a parallel path due to the fact that fewer connections need to be defect-free to initialize the module. However, a parallel path between the processor 24 and ROM 26 also may be used with a parallel interruption means, i.e., a MUX 36 with parallel paths or functionally equivalent combinational logic.

By interrupting the path between the ROM 26 and the processor 24 a relatively unintrusive testing method is created which does not alter the operating functionality of the MUT 20. This reduces the possibility that defects will be created or that existing defects will be masked by the testing.

As described above and shown in FIG. 2, the test system 22 is connected to the MUT 20 through a cable 40 connected to a test connector 38. The test connector may be located at an edge of the MUT opposite finger pins 48 or another type of connector used to electrically connect the MUT to a computer system with which it is designed to be used. By placing the test connector 38 on an edge of the MUT 20 opposite the finger pins 48, the module may be tested while seated properly in its slot of the computer system in which it is used. This eliminates the need for an extender card which may prevent testing the MUT in conjunction with the intended computer system.

One skilled in the art might not take this approach in creating a test arrangement due to the fact that module space is usually limited and therefore, additional components are not considered an option. However, the advantages outweigh the space restraint.

Following initialization, the processor may execute the code located in its I-cache. The test code may include processor initialization code as well as a testing sequence to be executed by the processor. The testing sequence can include whatever tests are deemed necessary, and is limited only by the size of the I-cache during initialization.

The test code may also include controller code which will allow the processor 24 to establish a two-way communication link with the test system 22 after initialization. The controller code can bring the processor up and configure the processor so that an input signal from the test system on the data input line 34 is supplied to a first internal processor register 50 and an output signal from a second internal processor register 52 is supplied on the data strobe line 30 to the test system. These two lines afford an interactive, two-way communication link between the processor and the test system in that the test system may run corresponding software which works in conjunction with the controller code running on the processor to allow the test system to pass command packets to the processor via the test code input line, and the processor to send status in the form of packets or specific data patterns to the test system via the data strobe line. When passing data from the processor to the test system via the data strobe line or when passing data from the test system to the processor via the data input line, the data transmission speed is not coupled to the processor's operating speed, but rather, it is controlled by the software running on both the test system and the processor.

Through use of the test code input 44 and the MUX 36, the test system can send command packets to the processor. The controller code may parse the command packets sent from the test system and then execute the command received at the processor's operating speed. Through a command such as "load", module resident memory/storage components or registers may be loaded with data sent from the test system, and through a "dump" command, these same locations may be examined. A "start" command may be used to initiate a previously loaded test or program. In this way, the test system may direct the processor to initiate certain tests, step through certain tests, load specific locations with data, read specific locations, etc.

The test system can request status information, possibly in the form of return status packets or specific bit patterns, through the use of other commands, such as "broadcast" which may indicate that the test system wants pass/fail status or "return status" which may indicate that the test system wants to know if a packet was received and understood properly. The processor returns the requested status via the data strobe line 30. In this way, the test system may be informed as to which tests passed or failed, or which steps within specific tests passed or failed, or other available information relevant to a failure.

These are only some of the possible commands that the test system can send to the processor.

Once the two-way communication link is established, the test system 22 does not have to wait for the processor to request data as was the case during initialization. Instead, the test system can send commands packets interactively via the communication link. The test system can send command packets at its discretion serially through the data input line 34 by packaging them appropriately with start and stop bits. When the hardware detects the start bit, the controller code may be notified and the packet may be accepted. The controller code running on the processor may be notified that a start bit has been received by having an interrupt generated when the internal register bit connected to the data line transitions between different logic states indicating that a start bit has been received, or the controller code may detect a transition of the register bit itself by polling the register bit to detect the reception of a start bit. The controller code may then parse the packet and, from information gained through the parse, determine the command received and the amount of data which constitutes the packet. The controller code will look for a stop bit when the expected amount of data has been received. Checksums or other error checking means can also be included in the packet to permit determination of the integrity of the received packet. The controller code will then execute the command received at the processor's operating speed and report status via the data strobe line 30, if so requested by the test system.

Through the two-way communication link, a packet may be used to set the controller code up for a burst mode transfer to enable comprehensive testing. A burst mode transfer will allow comprehensive tests which are expressed in more code than may be transferred to the processor during initialization due to the limitation imposed by the size of the processor's I-cache to be transferred to memory/storage components on the MUT 20 external to the processor 24 such as external cache 54 shown in FIG. 2. Many other types of memory components can be loaded with code in this way, for instance, flash PROMs (programmable ROMs), RAM (random access memory), and EEROMs (electrically erasable ROMs). After determining the defect on a MUT, a user such as a field service representative could load memory components with possible fixes for that defect. As will be described shortly, prior to a burst mode transfer, tests loaded into the processor may be executed by the controller code to determine if such external memory components are working properly.

The packet containing the burst mode command will provide an address indicating where the data received should be stored on the MUT as well as the amount of data to be sent. The controller code can then use the data strobe line 30 to request the data as was done during initialization without having to re-initialize the processor. This will allow a burst mode transfer to take place at a speed dictated by the speed of the controller code running on the processor and the corresponding software running on the test system. The controller code can use the data strobe line to report the status of the packet following the burst mode transfer if requested to do so by the test system.

The test system may include a user interface such as a video terminal 56 connected to a test computer 58. Test computer 58 is connected to the MUT 20 through the cable 40 and may serve as a means for controlling communications between the video terminal 56 and the MUT. The test computer may run software that works with controller code running on the processor such that user commands, entered through a keyboard on the video terminal 56, can be translated into user command packets and sent to the processor, via the test code input line 44, to be received and parsed by the controller code. The software running on the test computer 58 may request that the controller code return status after executing the commands sent. The test computer 58 may have means for receiving status via the processor's data strobe line 30 and means for translating this status into appropriate responses which are sent to the video terminal 56.

The software running on test computer 58 can load a set of pre-written tests into the processor on initialization of the module, or controller code can be loaded followed by an interactive loading of pre-written test code. If a failure occurs, whether testing is being conducted in volume manufacturing, during initial module testing, or by field service representatives at customer sites, a user involved with testing the MUT can use the video terminal 56 to select pre-written tests to load interactively into the processor or to step through a particular test or test sequence. A user familiar with programming may choose to write new tests to load interactively. The test system 22 can then be used to probe the MUT 20 through the processor 24 without losing error information due to re-initialization. The user can use the test system to determine more information about the failure in an attempt to specifically locate the defect.

The testing sequence loaded is completely at the user's discretion. Because the processor 24 is loaded with test code from the MUX 36 to which it is directly connected, only a small amount of untested hardware is relied upon to load the processor. This allows module testing using an "ever-increasing sphere approach," meaning that the testing sequence can begin with testing the processor 24 itself and then gradually move outward from the processor to progressively test other components on the MUT 20 and the computer system to which the MUT is connected. Increasing the sphere of hardware being tested by small increments of untested hardware allows an error to be isolated to a defect in the new hardware being tested. The two-way communication link allows the user to write and load tests to probe the area where the defect is believed to be without having to re-initialize the processor and risk losing an intermittent error.

The invention provides a relatively non-intrusive, processor-based computer module testing method and apparatus which allows the user maximum flexibility in testing the MUT 20 and the computer system for which the MUT was designed to be a part of.

Although the forgoing description has been with reference to a preferred embodiment of the invention, it is to be understood that variations in this preferred embodiment may be made without departing from the spirit of the invention, the scope of which is defined by the appended claims.

What is claimed is:

1. An apparatus, comprising:
 a computer module to be tested, including:
  a processor having a data input path for accepting code;
  means for storing initialization code, wherein the initialization code is executed by the processor to initialize the operation of the processor; and
  interrupting means connected to the storing means and to the processor data input path and disposed between the storing means and the processor; and
 means, coupled to the interrupting means, for inputting test code to the processor, wherein the interrupting means are responsive to the inputting means and the inputting means are capable of causing the interrupting means to substitute the test code for the initialization code to the processor on the processor data input path.

2. An apparatus according to claim 1, wherein the interrupting means comprises an element having a first input for the initialization code, a second input for the test code, an output connected to the processor data input path, and means for controlling the element to selectively connect the output to the first and second inputs.

3. An apparatus according to claim 1, wherein the interrupting means comprises a multiplexor.

4. An apparatus according to claim 1, wherein the interrupting means comprises a switch.

5. An apparatus according to claim 1, wherein the interrupting means comprises combinational logic functionally equivalent to a switch.

6. An apparatus according to claim 1, wherein the processor data input path is a serial path.

7. An apparatus according to claim 1, wherein the inputting means comprises a test system and communication means disposed between the test system and the interrupting means for supplying the test code to the processor.

8. An apparatus according to claim 7, wherein the communication means comprises a connector located on the computer module and a buffer interposed between the connector and the interrupting means to provide predetermined voltage and current levels to the connector and the computer module.

9. An apparatus according to claim 8, wherein the connector is located on a first edge of the computer module different from a second edge of the computer module used to connect the computer module to a computer system.

10. An apparatus according to claim 7, wherein the test system comprises a user interface and a computer disposed between the user interface and the communication means.

11. An apparatus according to claim 10, wherein the user interface enables interaction with the computer module during testing.

12. An apparatus according to claim 7, wherein the interrupting means comprises a multiplexor having a select line for controlling an output of the multiplexor and having a first data input and a second data input, and wherein the test system is connected via the communication means to the select line and to said second data input and wherein the storing means is connected to said first data input.

13. An apparatus according to claim 12, wherein the test system is further connected to a reset line and to a data strobe line of the processor, and wherein an output of the multiplexor is connected to the data input path of the processor.

14. An apparatus according to claim 13, wherein, following initialization, the processor data input path is connected to a first internal processor register and the data strobe line is connected to a second internal processor register.

15. An apparatus according to claim 1, wherein the test code comprises processor initialization code and a testing sequence to be executed by the processor to test the computer module.

16. An apparatus according to claim 15, wherein the computer module further comprises a plurality of components which interface the computer module to a computer system, and wherein the testing sequence to be executed by the processor is formed to test the processor and progressively to test other components on the computer module.

17. An apparatus according to claim 16, wherein the testing sequence is constructed to test portions of the computer system to which the computer module is interfaced.

18. An apparatus according to claim 15, wherein the test code further comprises controller code to establish a communication link between the inputting means and the processor.

19. A method of testing a computer module which includes a processor which receives code for initializing the operation of the processor, comprising the steps of:
 interrupting an initialization path to the processor; and
 inputting test code to the processor for execution by the processor as a substitute for the code received by the processor during initialization to initialize the processor and initiate testing of the computer module.

20. A method of testing a computer module according to claim 19, further comprising the steps of establishing a communication link with the processor, and supplying command packets to the processor and receiving status from the processor via the communication link.

21. A method of testing a computer module according to claim 20, wherein the command packet comprises a burst mode command, and the method further comprises the steps of receiving a data request from the processor and supplying data to the processor in response to the request.

22. A method of testing a computer module according to claim 19, wherein the initialization code is provided to a first data input of a multiplexor and wherein the test code is provided to a second data input of the multiplexor and wherein the step of interrupting the initialization path to the processor comprises the step of asserting a select line of the multiplexer to provide said second data input of the multiplexor to an output of the multiplexor connected to the processor.

23. A method of testing a computer module according to claim 22, wherein the step of inputting the test code to the processor comprises the steps of:
 asserting a reset line to the processor;
 deasserting a reset line to the processor;
 receiving a data strobe line from the processor; and
 providing test code to the second data input of the multiplexor.

24. A method of testing a according to claim 19, wherein the step of inputting test code to the processor comprises inputting test code at a speed different from an operating speed of the processor.

25. A method of testing a computer module according to claim 19, wherein the computer module is part of a computer system, and wherein the testing includes testing the computer system at the processor's operating speed.

* * * * *